(12) United States Patent
Chaichanavong et al.

(10) Patent No.: US 8,219,868 B1
(45) Date of Patent: Jul. 10, 2012

(54) QUASI-CYCLIC LOW-DENSITY PARITY-CHECK (QC-LDPC) ENCODER

(75) Inventors: Panu Chaichanavong, Mountain View, CA (US); Gregory Burd, San Jose, CA (US)

(73) Assignee: Marvell International Ltd., Hamilton (BM)

( * ) Notice: Subject to any disclaimer, the term of this patent is extended or adjusted under 35 U.S.C. 154(b) by 889 days.

(21) Appl. No.: 12/277,118

(22) Filed: Nov. 24, 2008

Related U.S. Application Data

(60) Provisional application No. 60/991,450, filed on Nov. 30, 2007.

(51) Int. Cl.
    *G08C 25/02* (2006.01)
    *H04L 1/18* (2006.01)
(52) U.S. Cl. ......... 714/748; 714/752; 714/758; 714/800
(58) Field of Classification Search .................. 714/748, 714/752, 758, 800
    See application file for complete search history.

(56) References Cited

U.S. PATENT DOCUMENTS

| | | | |
|---|---|---|---|
| 2006/0031734 A1* | 2/2006 | Stolpman | 714/752 |
| 2009/0063930 A1* | 3/2009 | Matsumoto et al. | 714/752 |
| 2010/0229066 A1* | 9/2010 | Matsumoto et al. | 714/752 |

* cited by examiner

*Primary Examiner* — Sam Rizk

(57) ABSTRACT

Systems and methods are provided for a quasi-cyclic low-density parity check (QC-LDPC) encoders that have reduced memory requirements. In some embodiments, the LDPC encoder may store a quasi-cyclic parity seed matrix instead of a full code generator matrix. The LDPC encoder may receive a plurality of user symbols and compute a parity seed vector based at least in part on the received user symbols. The LDPC encoder may then use the quasi-cyclic parity seed matrix and the parity seed vector to generate a plurality of parity symbols for the user symbols. In some embodiments, the LDPC encoder may generate a full code generator matrix from a quasi-cyclic parity seed matrix instead of storing the full code generator matrix.

22 Claims, 11 Drawing Sheets

$$B_{ij} = \begin{bmatrix} 1 & 0 & 0 & 1 & 0 \\ 0 & 1 & 0 & 0 & 1 \\ 0 & 0 & 1 & 0 & 0 \\ 1 & 0 & 1 & 0 & 1 \\ 0 & 1 & 0 & 1 & 0 \\ 1 & 0 & 0 & 1 & 0 \end{bmatrix} \quad \text{or} \quad B_{ij} = \begin{bmatrix} 0 & 0 & 0 & 1 & 0 \\ 0 & 0 & 0 & 0 & 1 \\ 0 & 0 & 0 & 0 & 0 \\ 1 & 0 & 0 & 0 & 0 \\ 0 & 1 & 0 & 0 & 0 \\ 0 & 0 & 1 & 0 & 0 \end{bmatrix}$$

QUASI-CYCLIC LOW-DENSITY PARITY-CHECK (QC-LDPC) ENCODER

CROSS-REFERENCE TO RELATED APPLICATIONS

This claims the benefit under 35 U.S.C. §119(e) of U.S. Provisional Application No. 60/991,450, filed Nov. 30, 2007, this application is hereby incorporated by reference herein in its entirety.

BACKGROUND OF THE DISCLOSURE

The disclosed technology relates generally to data encoding, and more particularly to quasi-cyclic low-density parity check (LDPC) encoders.

With the continuing demand for high-reliability transmission of information in digital communication and storage systems, and with the rapid increase in available computational power, various coding and decoding techniques have been investigated and applied to increase the performance of these systems. One such coding technique, low-density parity check (LDPC) coding, was first proposed in the 1960s, but was not used until the late 1990s when researchers began to investigate iterative coding and decoding techniques.

LDPC codes are among the few known error control coding techniques capable of transmitting information at a rate close to the Shannon limit or channel-capacity. Currently, LDPC codes are considered to be the next-generation communication system encoding standard. LDPC codes can be regular or irregular, have a linear or cyclic coding matrix, and can be decoded in a myriad of ways, ranging in complexity and error performance.

One concern with LDPC codes is that LDPC encoders may require large memory buffers to store code generator matrices, even though the parity-check matrix is sparse.

SUMMARY OF THE DISCLOSURE

Accordingly, quasi-cyclic low-density parity check (QC-LDPC) encoders are disclosed that have reduced memory requirements.

In some embodiments, the LDPC encoder may store a quasi-cyclic parity seed matrix instead of a full code generator matrix. The LDPC encoder may receive a plurality of user symbols and compute a parity seed vector based at least in part on the received user symbols. The LDPC encoder may then use the quasi-cyclic parity seed matrix and the parity seed vector to generate a plurality of parity symbols for the user symbols. Storing the quasi-cyclic parity seed matrix instead of a full code generator matrix may reduce the storage required for the LDPC encoder.

In some embodiments, the LDPC encoder may generate a full code generator matrix instead of storing the full code generator matrix. In these embodiments, the LDPC encoder may compute a parity seed vector based at least in part on a stored quasi-cyclic parity-check matrix. The quasi-cyclic parity-check matrix may be a sparse quasi-cyclic that can be stored without requiring large amounts of memory. The LDPC encoder may then use the quasi-cyclic parity seed matrix and the parity seed vector to generate the full code generator matrix.

BRIEF DESCRIPTION OF THE FIGURES

The above and other aspects and advantages of the invention will be apparent upon consideration of the following detailed description, taken in conjunction with the accompanying drawings, in which like reference characters refer to like parts throughout, and in which:

FIG. 3 is an illustrative quasi-cyclic matrix composed of a plurality of [5×5] circulants;

DETAILED DESCRIPTION OF THE DISCLOSURE

Figure 1:
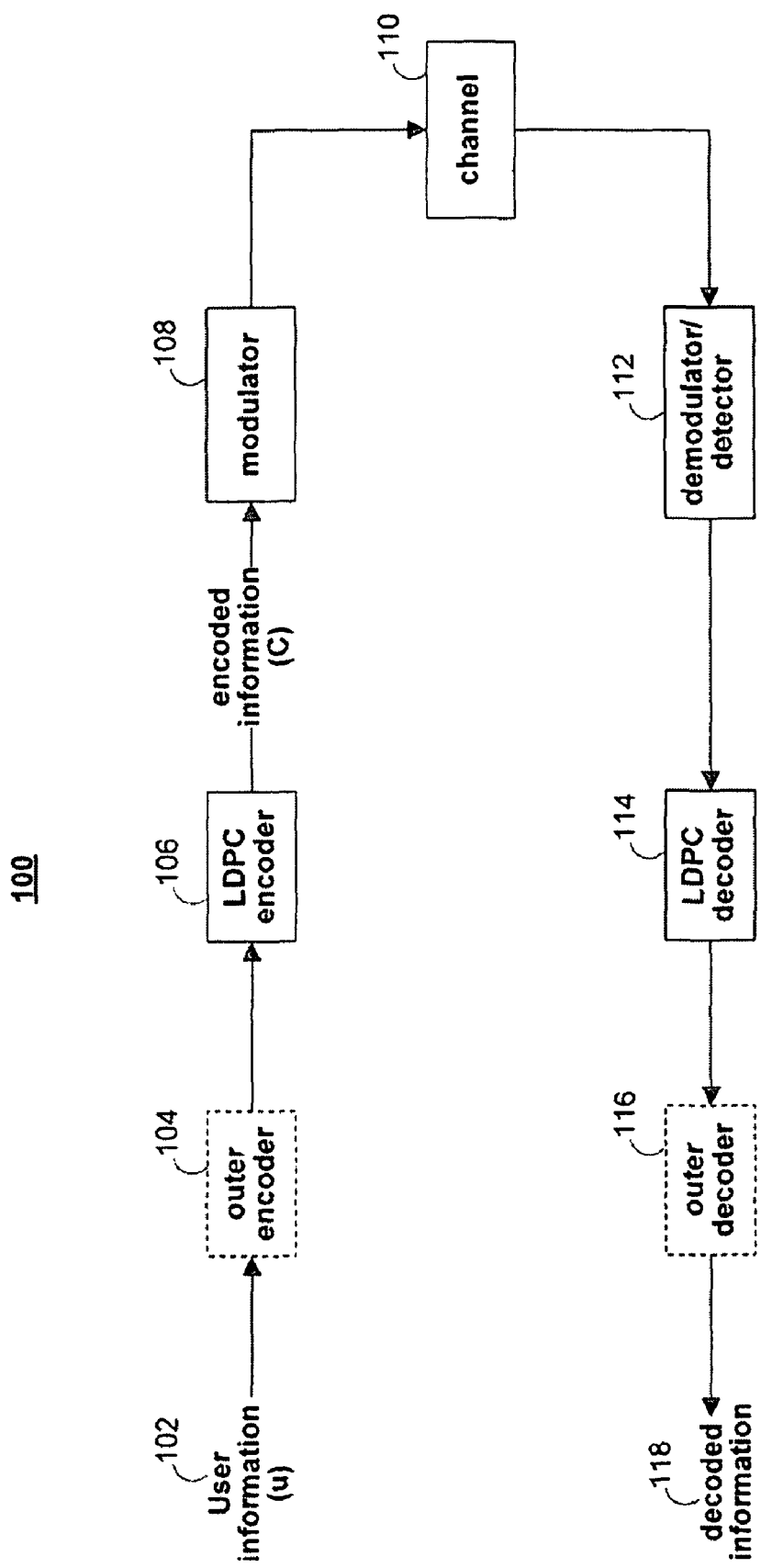
FIG. 1 is a simplified block diagram of an LDPC error-correcting communications or storage system.

FIG. 1 shows a simplified and illustrative block diagram of digital communications or storage system 100 that can employ the disclosed technology. System 100 may include LDPC encoder 106, modulator 108, demodulator 112, and LDPC decoder 114, and optionally outer encoder 104 and outer decoder 116. In some embodiments, system 100 may be any suitable communications system that is used to transmit user information 102 from a source to a destination. In other embodiments, system 100 may be a suitable storage system which is used to store and read back user information from a storage medium. User information 102, sometimes referred to by the variable u, may be any form of information or useful data that a user desires to transmit or store, and can be in any suitable digital form (e.g., coded data, uncoded data, etc.).

User information 102 may be transmitted or stored using one or more information-bearing signals. The signals may be transmitted or stored in any suitable transmission or storage medium or media, represented in FIG. 1 by channel 110. For example, channel 110 may be a wired or wireless medium through which the information-bearing signal travels, or an optical (e.g., a CD-ROM), magnetic (e.g., a hard disk), or electrical (e.g., FLASH memory or RAM) storage medium that stores the information-bearing signal. Due to random noise that may occur during transmission and storage, as well as the limited transmission or storage capabilities of channel 110, the information-bearing signal may be corrupted or degraded while being transmitted or stored. Thus; the signal received from channel 110 (e.g., by demodulator 112) may be substantially different than the signal that was originally transmitted or stored (e.g., from modulator 108). To reliably transmit or store information in channel 110, an effective transmitter for preparing and transmitting user information 102 may be needed, as well as a corresponding effective receiver for accurately interpreting user information 102 from a received signal.

In FIG. 1, the transmitter in communications or storage system 100 is embodied by outer encoder 104 (if present), LDPC encoder 106, and modulator 108. The receiver (described below) is embodied by demodulator 112, LDPC decoder 114, and outer decoder 116 (if present). Outer encoder 104 and LDPC encoder 106 may encode user information 102 into encoded information, sometimes referred to by the variable, c. In particular, outer encoder 104 may first encode user information 102 using a suitable code, which may be a systematic code. For example, outer encoder 104 may encode user information 102 using a Bose-Chaudhuri-Hocquenghem (BCH) or Reed-Solomon (RS) code of any suitable correction power. LDPC encoder 106 may then encode the resulting codeword into encoded information c. LDPC encoder 106 may operate concurrently or subsequent to outer encoder 104 using a suitable low-density parity check (LDPC) code that is selected from among a plurality of available LDPC codes.

Once LDPC encoder 106 produces the encoded information, modulator 108 may convert the encoded information into an information-bearing signal for transmission or storage in channel 110. Modulator 108 may operate using a modulation scheme with a signal constellation set of any suitable size and dimension. For example, modulator 108 may use a quadrature amplitude modulation (QAM) scheme (e.g., 4QAM, 16QAM, 32QAM, etc.), a pulse amplitude modulation (PAM) scheme (e.g., 2PAM, 4PAM, 8PAM, etc.), a phase shift keying (PSK) scheme (e.g., QPSK, 8PSK, etc.), and/or a orthogonal frequency division multiplexing (OFDM) scheme. The type of modulation scheme used by modulator 108 may be selected and implemented based on the properties of channel 110.

Demodulator 112 may receive an altered version of the information-bearing signal transmitted or stored by modulator 108. Demodulator 112 may then convert the information-bearing signal back into a digital sequence using the same modulation scheme as that of modulator 108. Demodulator 112 therefore produces a hard-bit or soft-bit estimate of the encoded information, c, that is decoded by LDPC decoder 114 and outer decoder 116. LDPC decoder 114 and outer decoder 116 may decode the estimated encoded information using the same LDPC and outer code, respectively, as those used by LDPC encoder 106 and outer encoder 108 to produce decoded information 108. Thus, if the hard-bit or soft-bit estimate is within the correcting capability of the LDPC and outer codes employed by decoders 114 and 116, decoded information 108 may be the same as user information 102.

As described above, communications or storage system 100 may or may not include outer encoder 104 and outer decoder 116. For purposes of clarity, and not by way of limitation, the various embodiments disclosed herein will often be described as if no outer code is used. For example, various embodiments may be described in which an LDPC encoder directly encodes user information (e.g., LDPC encoder 106 directly encoders user information 102). However, it should be understood that any of the disclosed embodiments of an LDPC encoder may instead encode the output of an outer encoder.

Figure 2:
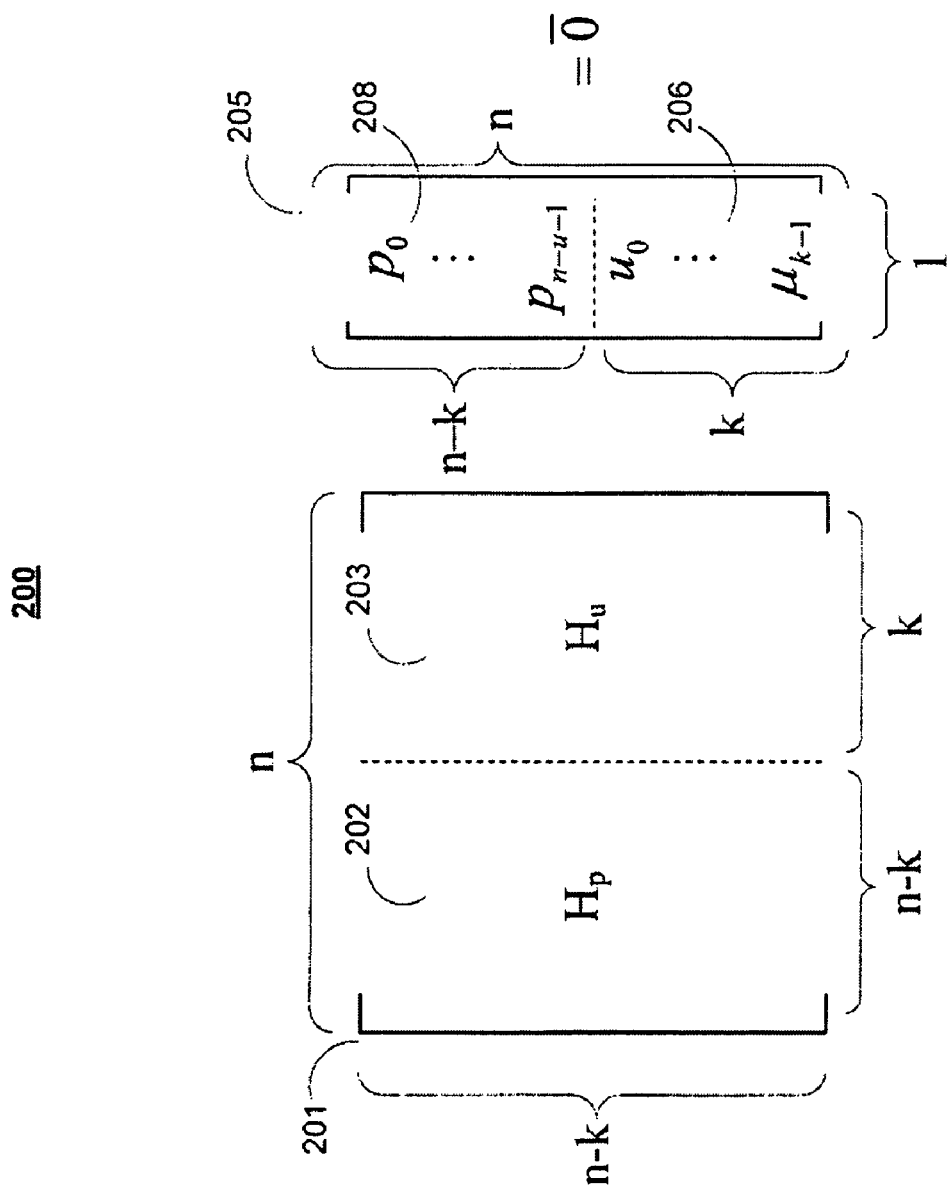
FIG. 2 is an LDPC coding equation based on a quasi-cyclic parity check matrix.

FIG. 2 shows illustrative coding equation 200 that is satisfied when LDPC encoder 106 (FIG. 1) generates encoded information, c, based on a QC-LDPC code defined by parity check matrix 201. In particular, LDPC encoder 106 creates the encoded information, c, in the form of codeword vector 205 that satisfies equation 200. Codeword vector 205 is composed of n data components made up of user information sub-vector 206, having k data components $u_0 \ldots u_{k-1}$, and parity sub-vector 208, having n-k parity components $p_0 \ldots p_{n-k-1}$. Since user information sub-vector 206 represents user information 102 (FIG. 1) in vector form, LDPC encoder 106 (FIG. 1) generates codeword vector 205 by computing the parity components of parity sub-vector 208.

Parity check matrix 201 is an illustrative parity check matrix defining a particular quasi-cyclic LDPC code that may be employed by LDPC encoder 106 (FIG. 1) and LDPC decoder 114 (FIG. 1) of system 100 (FIG. 1). As a quasi-cyclic parity check matrix, parity check matrix 201 is composed of [(n−k)×n] circular submatrices (circulants) of the same size. A circulant submatrix is a square [m×m] binary matrix with the property that, each row is a shifted version of a previous row.

FIG. 3 shows an illustrative quasi-cyclic matrix 310 composed of a plurality of [5×5] circulants 311 which may be useful in explaining the structure of parity check matrix 201 (FIG. 2). Each circulant 311 may be a zero matrix (e.g., matrix of all zeros), a one matrix (e.g., matrix of all ones), an identity matrix, an identity matrix shifted by some amount, or any other arbitrary circulant. Circulants 320 and 330 are two exemplary circulant submatrices.

A quasi-cyclic matrix may be considered a sparse matrix if the circulants of the matrix have low row/column weight. The amount of storage required for a sparse quasi-cyclic matrix composed of a plurality of circulants may be reduced by representing each circulant in the matrix using a shorthand notation. For example, each circulant may be represented by storing the positions of the one-bits in its first row (or first column). This compressed representation may be used to store quasi-cyclic parity check matrix in a QC-LDPC coding system, such as that illustrated in FIG. 1. In contrast, a dense quasi-cyclic matrix is composed of a plurality of circulants having a high row/column weight. It may not be practical to store a dense quasi-cyclic matrix using the reduced representation used to store a sparse quasi-cyclic matrix. Alternatively, storing a dense quasi-cyclic matrix using the reduced representation may not significantly affect the amount of storage required to store the a dense quasi-cyclic matrix.

Returning to FIG. 2, parity check matrix 201 may be represented by a data portion (or the $H_u$ matrix) and a parity portion (or the $H_p$ matrix). The $H_u$ matrix includes the circulants in parity check matrix 201 that are multiplied by data symbols in data sub-vector 206 in equation 200, while the $H_p$ matrix includes the circulants in parity check matrix 201 that are multiplied by parity symbols in parity sub-vector 208. In this manner, the [(n−k)×n] circulants of parity check matrix 201 may be divided into the $H_p$ matrix having [(n−k)×(n−k)] circulants and the $H_u$ matrix having [(n−k)×k] circulants. Because parity check matrix 201 is sparse, it may be stored using as few as [(n−k)×n] symbols in a reduced format instead of using [(n−k)*m×n*m] symbols.

Coding equation 200 shown in FIG. 2 may also be written as:

$$Hc = 0 \quad (EQ. 1)$$

where H is a parity check matrix and c is a codeword vector. Equivalently, parity check matrix H may be written as the combination of parity portion $H_p$ and data portion $H_u$ and encoded information c may be written as parity information p and user information u. Based on this, equation 1 may be rewritten as:

$$[H_p \ H_u] \cdot \begin{bmatrix} p \\ u \end{bmatrix} = 0 \quad (EQ. 2)$$

An LDPC encoder generates parity information p based on user information u such that equations 1 and 2 are satisfied. Equation 2 may be further rewritten as:

$$H_p p = H_u u \quad \text{(EQ. 3)}$$

$$p = H_p^{-1} H_u u \quad \text{(EQ. 4a)}$$

$$p = Gu \quad \text{(EQ. 4b)}$$

where G is an LDPC generator matrix. Equation 4b therefore shows that parity information p can be generated from user information u using LDPC generator matrix G. Parity check matrix H and its components $H_p$ and $H_u$ are sparse quasi-cyclic matrices and may be stored using the reduced storage technique discussed above. G is a dense quasi-cyclic $[(n-k) \times k]$ matrix of $[m \times m]$ circulants. Therefore, even though LDPC generator matrix G has the same dimension as data portion $H_u$, G cannot be stored using the reduced storage technique. Therefore using G to generate parity information p may require a large amount of storage. Furthermore, for several quasi-cyclic LDPC codes, $H_p$ is not invertible. For these codes, G cannot be generated from $H_p^{-1}$ and $H_u$ according to equations 4a and 4b.

Figure 4:
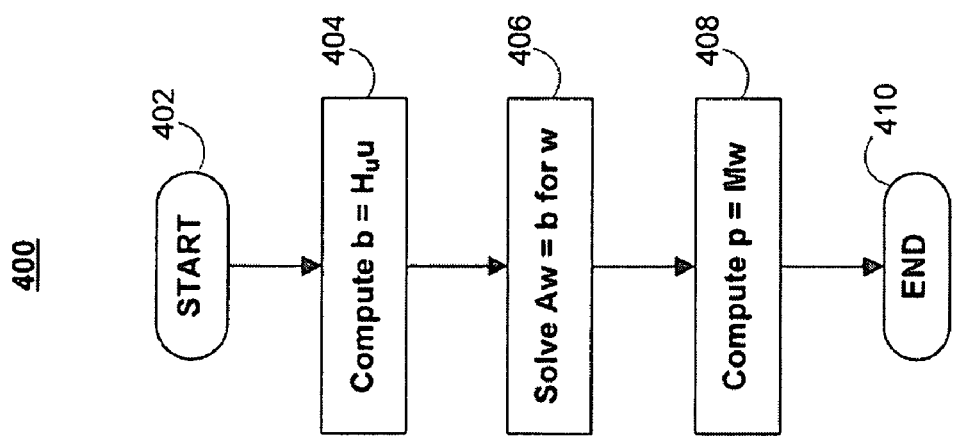
FIG. 4 is a flowchart of an illustrative process for generating parity information in an LDPC encoder with reduced storage requirements.

FIG. 4 is a flowchart of an illustrative process 400 for generating parity information p with reduced storage requirements. In particular, this illustrative process can be used to generate parity information p within an LDPC encoder (e.g., LDPC encoder 106 (FIG. 1)) using a quasi-cyclic LDPC code without having to store LDPC generator matrix G. Instead of storing LDPC generator matrix G, the reduced-storage LDPC encoder may stores smaller quasi-cyclic parity seed matrix M. Matrix M is a dense, quasi-cyclic $[(n-k) \times (n-k)]$ matrix of $[m \times m]$ circulants. Even though matrix M is dense and cannot be stored using the reduced storage technique, it contains $[(n-k) \times (2k-n)]$ fewer $[m \times m]$ circulants than LDPC generator matrix G. Thus, storing quasi-cyclic parity seed matrix M instead of LDPC generator matrix G may require up to 75% less storage space, depending on the code rate. The higher the code rate the larger the parity-check matrix and therefore the greater the storage space savings that may be achieved. Matrix M may be computed such that:

$$H_p M = A \quad \text{(EQ. 5)},$$

where A is a matrix having the same dimensions as matrix M. Matrix A may be selected such that the equation:

$$Aw = b \quad \text{(EQ. 6)}$$

is easy to solve. For example, A may be a sparse, quasi-cyclic $[(n-k) \times (n-k)]$ matrix of $[m \times m]$ circulants. A process for solving equation 6 will be discussed in greater detail below.

For ease of explanation, process 400 will be described with illustrative parameter values of n=16, k=13, and m=4. Accordingly, with these values matrix M will be a dense, quasi-cyclic [3×3] matrix of [4×4] circulants and matrix A will be a sparse, quasi-cyclic [3×3] matrix of [4×4] circulants. It should be understood that any other suitable values may be used.

Process 400 may begin at step 402. At step 404, b is computed as:

$$b = H_u u \quad \text{(EQ. 7)}$$

Figure 5:
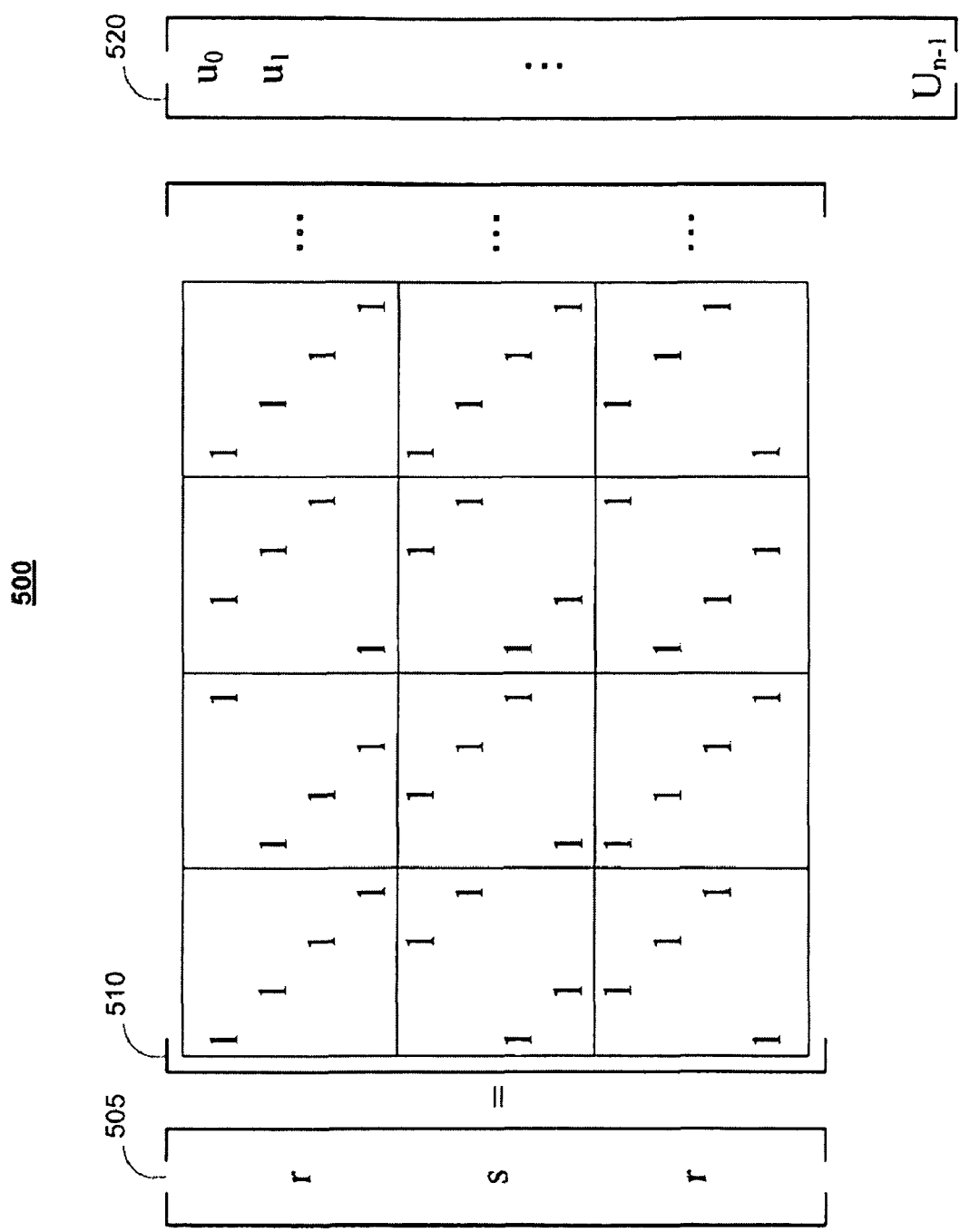
FIG. 5 is an illustration of an equation that may be used to solve for a parity seed vector in an LDPC encoder.

Equation 7 may be computed with relatively little complexity because data portion matrix $H_u$ is sparse and quasi-cyclic. Equation 7 is illustrated in more detail in FIG. 5, where b is written as [r;s;t], where r, s, and t are vectors with the same dimension as the circulants. Namely, b is represented by (n−k) vectors each having m symbols or in this case three vectors each having four symbols.

One illustrative low-complexity approach for computing b according to equation 6 is to initialize the subvectors of b, (r;s;t), to zero and then to XOR each bit of u with the corresponding entry of [r;s;t] according to $H_u$. Recall that each of the data components $u_0 \ldots u_{n-1}$ of u contain m symbols. Using this approach, the values of [r;s;t] based on the four symbols of $u_0$ may be computed as follows:

$$u_{0,0} : r_0 = r_0 + u_{0,0}; s_2 = s_2 + u_{0,0}; t_3 = t_3 + u_{0,0}$$

$$u_{0,1} : r_1 = r_1 + u_{0,1}; s_3 = s_3 + u_{0,1}; t_0 = t_0 + u_{0,1}$$

$$u_{0,2} : r_2 = r_2 + u_{0,2}; s_0 = s_0 + u_{0,2}; t_1 = t_1 + u_{0,2}$$

$$u_{0,3} : r_3 = r_3 + u_{0,3}; s_1 = s_1 + u_{0,3}; t_2 = t_2 + u_{0,3} \quad \text{(EQ. 8)}$$

Similar equations may be written for each of the other data components of u based on their respective column circulants of $H_u$.

Returning to FIG. 4, at step 406 equation 6 may be solved for parity seed vector w. As mentioned above, matrix A may be selected such that this equation is easy to solve. For example, matrix A may be set to:

$$A = \begin{bmatrix} I & I & I \\ S & I & I \\ I & S & I \end{bmatrix} \quad \text{(EQ. 9)}$$

where I is the identity matrix and S is the matrix obtained by cyclically shifting the identity matrix to the left by one. That is, S has the form:

$$S = \begin{bmatrix} 0 & 0 & 0 & 1 \\ 1 & 0 & 0 & 0 \\ 0 & 1 & 0 & 0 \\ 0 & 0 & 1 & 0 \end{bmatrix} \quad \text{(EQ. 10)}$$

If w is written as [x;y;z], equation 6 can be rewritten as:

$$\begin{bmatrix} I & I & I \\ S & I & I \\ I & S & I \end{bmatrix} \begin{bmatrix} x \\ y \\ z \end{bmatrix} = \begin{bmatrix} r \\ s \\ t \end{bmatrix} \quad \text{(EQ. 11)}$$

Equation 11 can be written as three equations:

$$Ix + Iy + Iz = r \quad \text{(EQ. 12)}$$

$$Sx + Iy + Iz = s \quad \text{(EQ. 13)}$$

$$Ix + Sy + Iz = t \quad \text{(EQ. 14)}$$

Summing equations 12 and 13:

$$(S+I)x = r+s \quad \text{(EQ. 15)}$$

where:

$$S + I = \begin{bmatrix} 1 & 0 & 0 & 1 \\ 1 & 1 & 0 & 0 \\ 0 & 1 & 1 & 0 \\ 0 & 0 & 1 & 1 \end{bmatrix} \quad \text{[EQ. 16]}$$

Equation 15 can then be written as:

$$x_0+x_3=r_0+s_0 \quad (EQ. 17)$$

$$x_0+x_1=r_1+s_1 \quad (EQ. 18)$$

$$x_1+x_2=r_2+s_2 \quad (EQ. 19)$$

$$x_2+x_3=r_3+s_3 \quad (EQ. 20)$$

Because equations 17-20 are redundant, $x_3$ may be set to 0. Then $x_0=r_0+s_0$ and all of the values of x can be calculated. The value of vector y can be calculated in a similar manner from r and t. Finally, since x+y+z=r (equation 12) z can be calculated based on z=r+x+y.

Returning to FIG. 4, at step 408 parity information p can be calculated from:

$$p=Mw \quad (EQ. 21)$$

using conventional matrix multiplication techniques. Process 400 may then end at step 410. Using this approach, parity information p can be calculated without having to store LDPC generator matrix G. However, this approach does require that a new solution for parity seed vector w (step 406) be computed for each set of user information u. This computation may add some latency to the encoding process.

Another approach for calculating parity information p can combine the reduced storage requirements of the previous approach while also reducing latency. In particular, the current approach allows LDPC generator matrix G to be computed rather than stored. Because LDPC generator matrix G can be computed independent of user information u, the latency may be reduced. For ease of explanation, it will be assumed that user information u is only one circulant long. However, it should be understood that the following approach may be used for any length of user information u. u can be written as:

$$u=[u_0\ u_1 \ldots u_{c-1}]=u_0e_0+u_1e_1+\ldots+u_{c-1}e_{c-1} \quad (EQ. 22)$$

where $e_k$ is the kth column of the identity matrix. Equation 3, $H_p p = H_u u$, can be written as:

$$H_p g_k = H_u e_k \quad (EQ. 23)$$

because:

$$p=Gu=u_0 g_0+u_1 g_1+\ldots+u_{c-1} g_{c-1} \quad (EQ. 24)$$

where:

$$G=[g_0\ g_1 \ldots g_{c-1}] \quad (EQ. 25)$$

Recall that G is quasi-cyclic. Thus, if $g_0$ is computed the other components of G can be generated by shifting $g_0$. Equation 23 can be used to compute $g_0$ using similar steps to those described above with respect to process 400 (FIG. 4). First, b is defined as:

$$b=H_u e_0 \quad (EQ. 26)$$

Second, the equation 6 (Aw=b) can be solved for parity seed vector w based on vector b of equation 26. Finally:

$$g_0=Mw \quad (EQ. 27)$$

Solving Aw=b for w may be performed using the same techniques described above with respect to step 406 of process 400. In particular, b can be written as [r;s;t], where the vectors r, s, and t each have a weight of 1, and w can be written as [x,y,z]. Then x, y, and z can solved using the equations:

$$(S+I)x=r+s \quad (EQ. 28)$$

$$(S+I)y=r+t \quad (EQ. 29)$$

$$z=x+y+r \quad (EQ. 30)$$

Because r and s have a weight of 1, equation 28 can be written as:

$$r+s=e_{i_1}+e_{i_2} \quad (EQ. 31)$$

Figure 6:
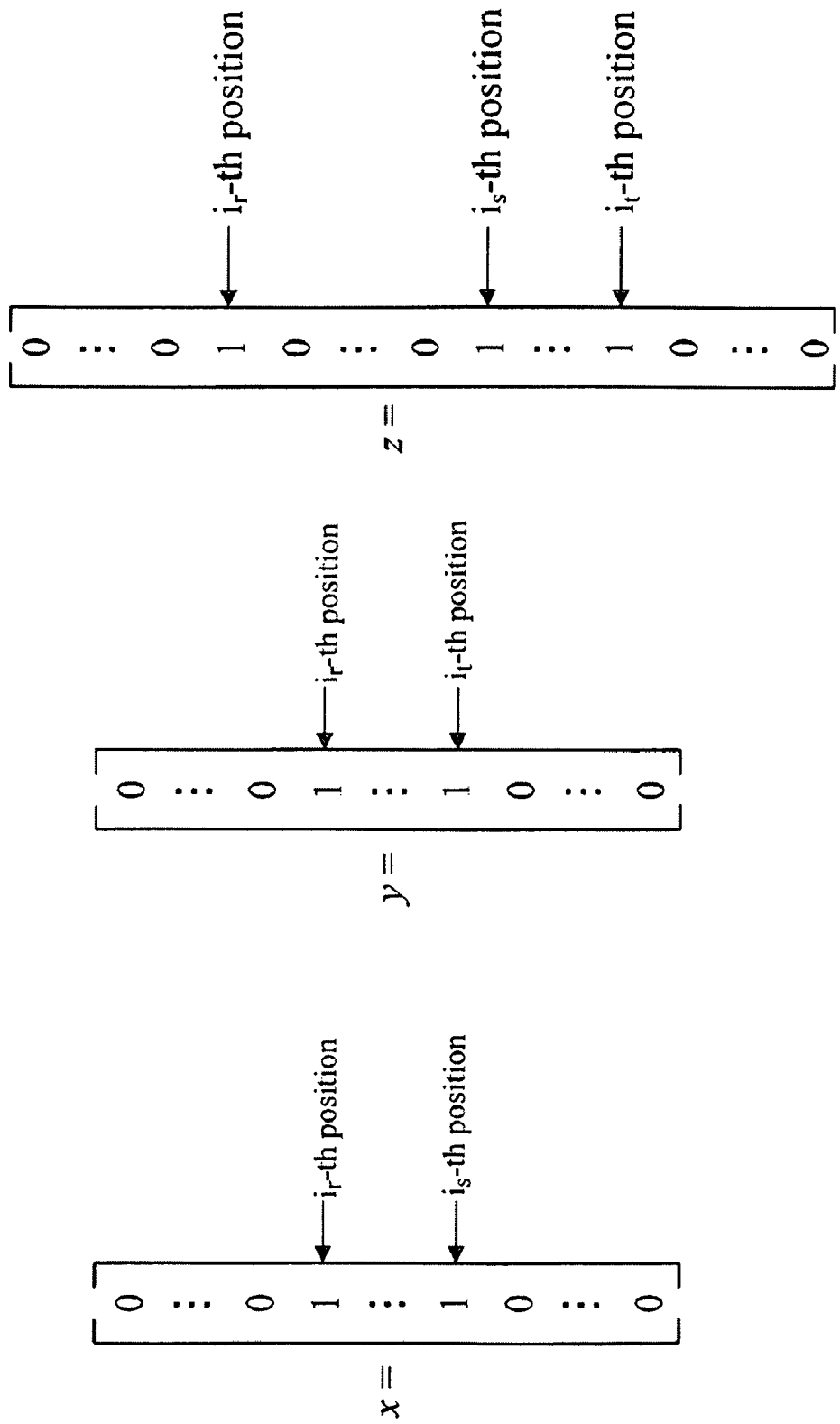
FIG. 6 is an illustration solutions for vectors x, y, and z that may be used to solve for a parity seed vector in an LDPC encoder.

FIG. 6 shows illustrative solutions for vectors x, y, and z.

Finally, equation 27 may be computed by multiplying M and w. This multiplication may be simplified based upon the quasi-cyclic structure of M and the structure of vectors x, y, and z. The multiplication of M and w can be broken up into smaller calculations by separately multiplying each of the circulants of M by each of the vectors x, y, and z of w. For example, $M_0$ a first circulant may be multiplied by vector x as follows. The first row of circulant $M_0$ can be written as $[m_0\ m_1 \ldots m_{c-1}]$. Alternatively, the first row of circulant $M_0$ can be written as a cumulative sum vector $[m_0\ m_{0+}m_1 \ldots m_0+m_1+\ldots+m_{c-1}]$. Then each entry of $M_0 x$ is the XOR of entries from the cumulative sum vector.

For example, if:

$$x = \begin{bmatrix} 0 \\ 1 \\ 1 \\ 0 \\ 0 \end{bmatrix} \quad (EQ. 32)$$

and the cumulative sum vector of the first row of $M_0$ is:

$$CS=[m_0\, m_0+m_1\, m_0+m_1+m_2\, m_0+m_1+m_2+m_3\, m_0+m_1+m_2+m_3+m_4] \quad (EQ. 33)$$

then $$M_0 x = \begin{bmatrix} m_1+m_2 \\ m_2+m_3 \\ m_3+m_4 \\ m_4+m_0 \\ m_0+m_1 \end{bmatrix} = \begin{bmatrix} cs_2+cs_0 \\ cs_3+cs_1 \\ cs_4+cs_2 \\ cs_4+cs_3+cs_0 \\ cs_1 \end{bmatrix} \quad (EQ. 34)$$

Even though this example shows that calculating $M_0 x$ using either the standard representation or the cumulative representations of the first row of $M_0$ required approximately the same number of addition operations, the benefit of the cumulative representation will increase as the size of the circulants increases. Similar calculations can be used with the other circulants of M by each of the vectors x, y, and z to calculate $g_0$.

Finally, using $g_0$ a value for the LDPC generator matrix G can be calculated.

Referring now to FIGS. 7A-7G, various exemplary implementations of the present invention are shown.

Figure 7A:
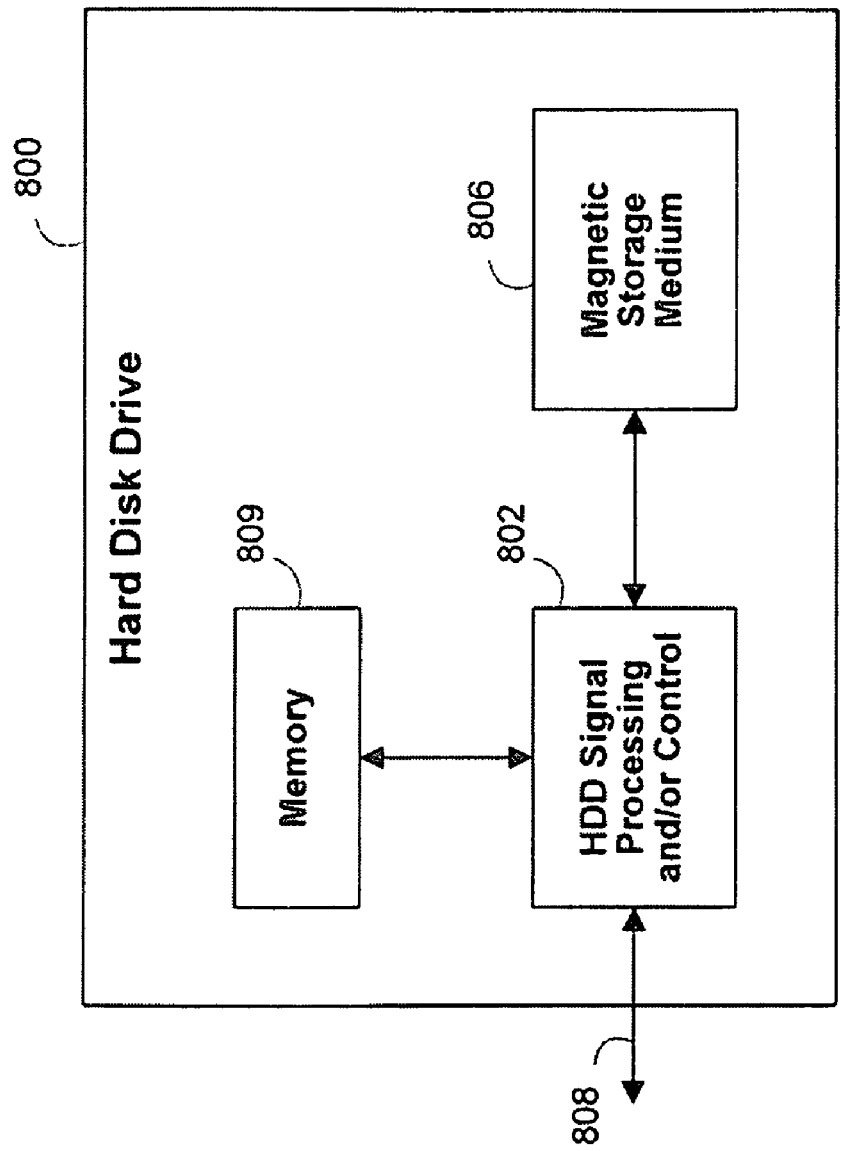
FIG. 7A is a block diagram of an exemplary hard disk drive that can employ the disclosed technology.

Referring now to FIG. 7A, the present invention can be implemented in a hard disk drive (HDD) 800. The present invention may implement either or both signal processing and/or control circuits, which are generally identified in FIG. 7A at 802. In some implementations, the signal processing and/or control circuit 802 and/or other circuits (not shown) in the HDD 800 may process data, perform coding and/or encryption, perform calculations, and/or format data that is output to and/or received from a magnetic storage medium 806.

The HDD 800 may communicate with a host device (not shown) such as a computer, mobile computing devices such as personal digital assistants, cellular phones, media or MP3 players and the like, and/or other devices via one or more wired or wireless communication links 808. The HDD 800 may be connected to memory 809 such as random access memory (RAM), low latency nonvolatile memory such as flash memory, read only memory (ROM) and/or other suitable electronic data storage.

Figure 7B:
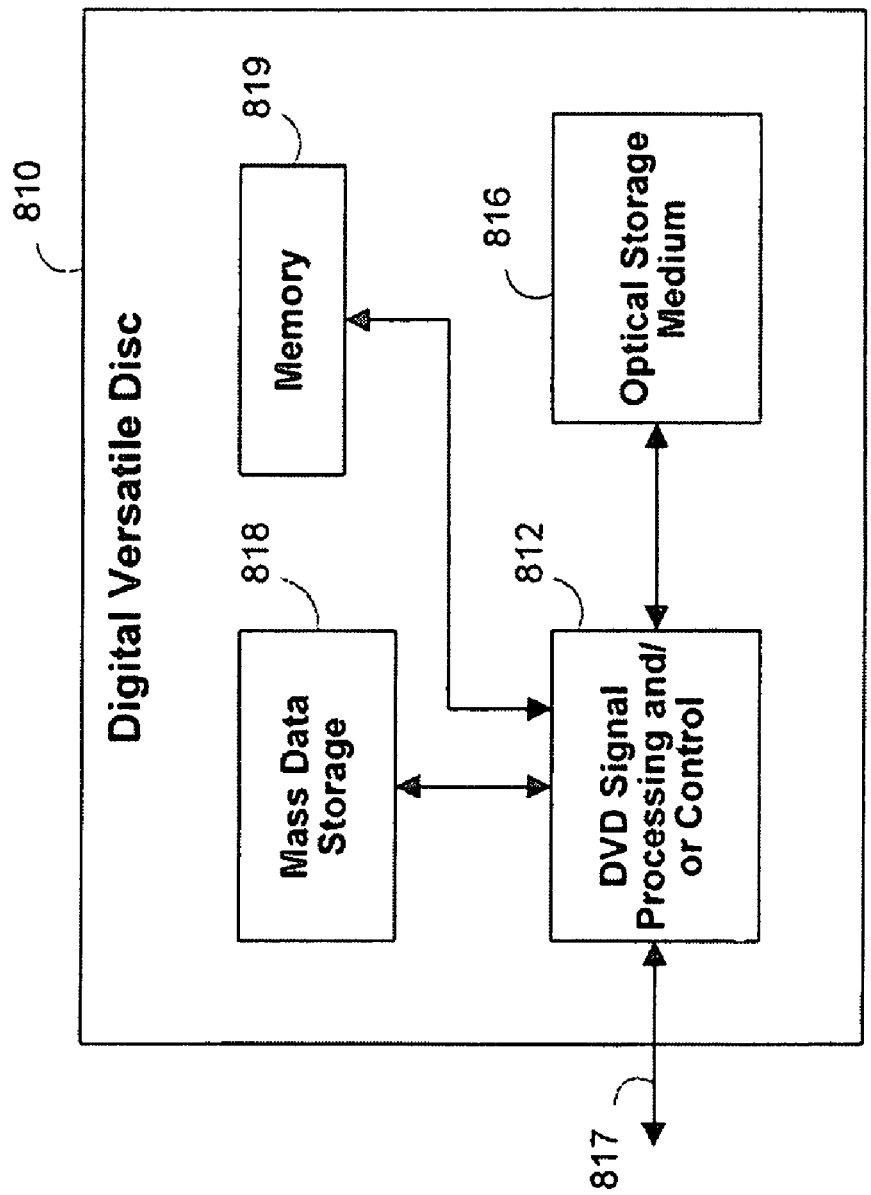
FIG. 7B is a block diagram of an exemplary digital versatile disc that can employ the disclosed technology.

Referring now to FIG. 7B, the present invention can be implemented in a digital versatile disc (DVD) drive 810. The present invention may implement either or both signal processing and/or control circuits, which are generally identified in FIG. 7B at 812, and/or mass data storage of the DVD drive 810. The signal processing and/or control circuit 812 and/or other circuits (not shown) in the DVD drive 810 may process data, perform coding and/or encryption, perform calculations, and/or format data that is read from and/or data written to an optical storage medium 816. In some implementations, the signal processing and/or control circuit 812 and/or other circuits (not shown) in the DVD drive 810 can also perform other functions such as encoding and/or decoding and/or any other signal processing functions associated with a DVD drive.

The DVD drive 810 may communicate with an output device (not shown) such as a computer, television or other device via one or more wired or wireless communication links 817. The DVD drive 810 may communicate with mass data storage 818 that stores data in a nonvolatile manner. The mass data storage 818 may include a hard disk drive (HDD). The HDD may have the configuration shown in FIG. 7A. The HDD may be a mini HDD that includes one or more platters having a diameter that is smaller than approximately 1.8". The DVD drive 810 may be connected to memory 819 such as RAM, ROM, low latency nonvolatile memory such as flash memory and/or other suitable electronic data storage.

Figure 7C:
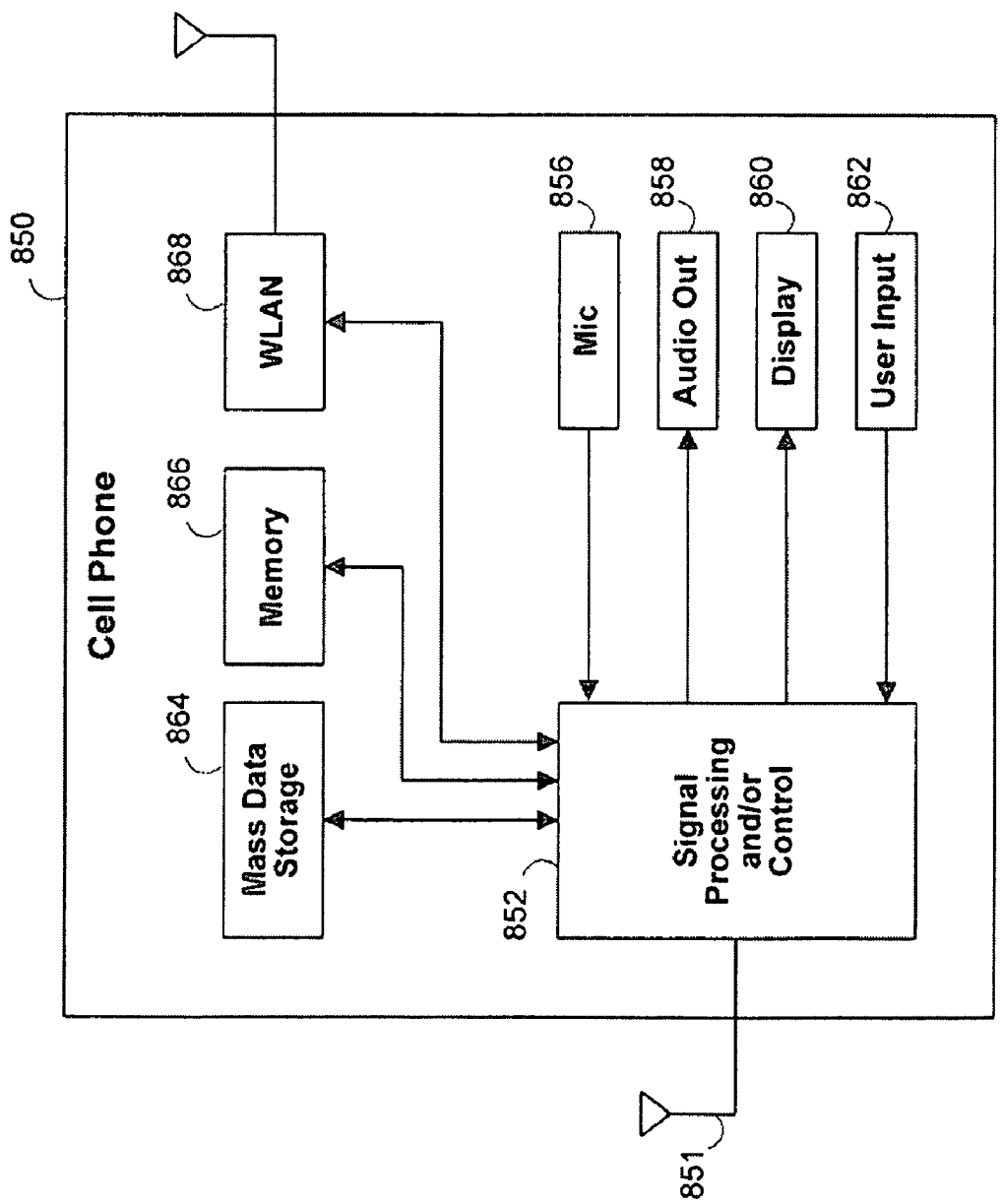
FIG. 7C is a block diagram of an exemplary cell phone that can employ the disclosed technology.

Referring now to FIG. 7C, the present invention can be implemented in a high definition television (HDTV) 820. The present invention may implement either or both signal processing and/or control circuits, which are generally identified in FIG. 7C at 822, a WLAN interface and/or mass data storage of the HDTV 820. The HDTV 820 receives HDTV input signals in either a wired or wireless format and generates HDTV output signals for a display 826. In some implementations, signal processing circuit and/or control circuit 822 and/or other circuits (not shown) of the HDTV 820 may process data, perform coding and/or encryption, perform calculations, format data and/or perform any other type of HDTV processing that may be required.

The HDTV 820 may communicate with mass data storage 827 that stores data in a nonvolatile manner such as optical and/or magnetic storage devices, for example, hard disk drives and/or DVD drives. At least one HDD may have the configuration shown in FIG. 7A and/or at least one DVD drive may have the configuration shown in FIG. 7B. The HDD may be a mini HDD that includes one or more platters having a diameter that is smaller than approximately 1.8". The HDTV 820 may be connected to memory 828 such as RAM, ROM, low latency nonvolatile memory such as flash memory and/or other suitable electronic data storage. The HDTV 820 also may support connections with a WLAN via a WLAN interface 829.

Figure 7D:
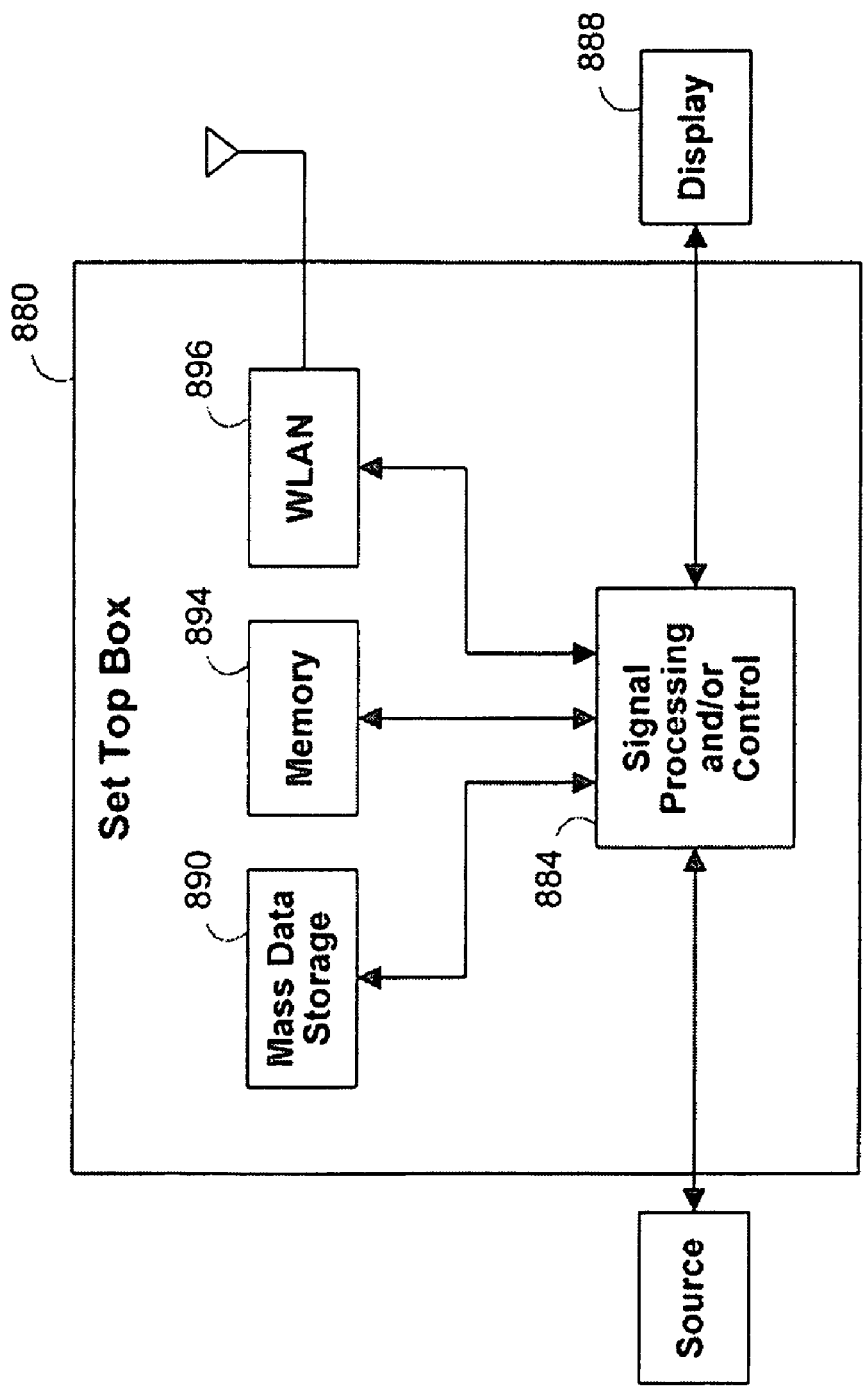
FIG. 7D is a block diagram of an exemplary set top box that can employ the disclosed technology.

Referring now to FIG. 7D, the present invention implements a control system of a vehicle 830, a WLAN interface and/or mass data storage of the vehicle 830. In some implementations, the present invention may implement a powertrain control system 832 that receives inputs from one or more sensors such as temperature sensors, pressure sensors, rotational sensors, airflow sensors and/or any other suitable sensors and/or that generates one or more output control signals such as engine operating parameters, transmission operating parameters, braking parameters, and/or other control signals.

The present invention may also be implemented in other control systems 840 of the vehicle 830. The control system 840 may likewise receive signals from input sensors 842 and/or output control signals to one or more output devices 844. In some implementations, the control system 840 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 832 may communicate with mass data storage 846 that stores data in a nonvolatile manner. The mass data storage 846 may include optical and/or magnetic storage devices for example hard disk drives and/or DVD drives. At least one HDD may have the configuration shown in FIG. 7A and/or at least one DVD drive may have the configuration shown in FIG. 7B. The HDD may be a mini HDD that includes one or more platters having a diameter that is smaller than approximately 1.8". The powertrain control system 832 may be connected to memory 847 such as RAM, ROM, low latency nonvolatile memory such as flash memory and/or other suitable electronic data storage. The powertrain control system 832 also may support connections with a WLAN via a WLAN interface 848. The control system 840 may also include mass data storage, memory and/or a WLAN interface (all not shown).

Figure 7E:
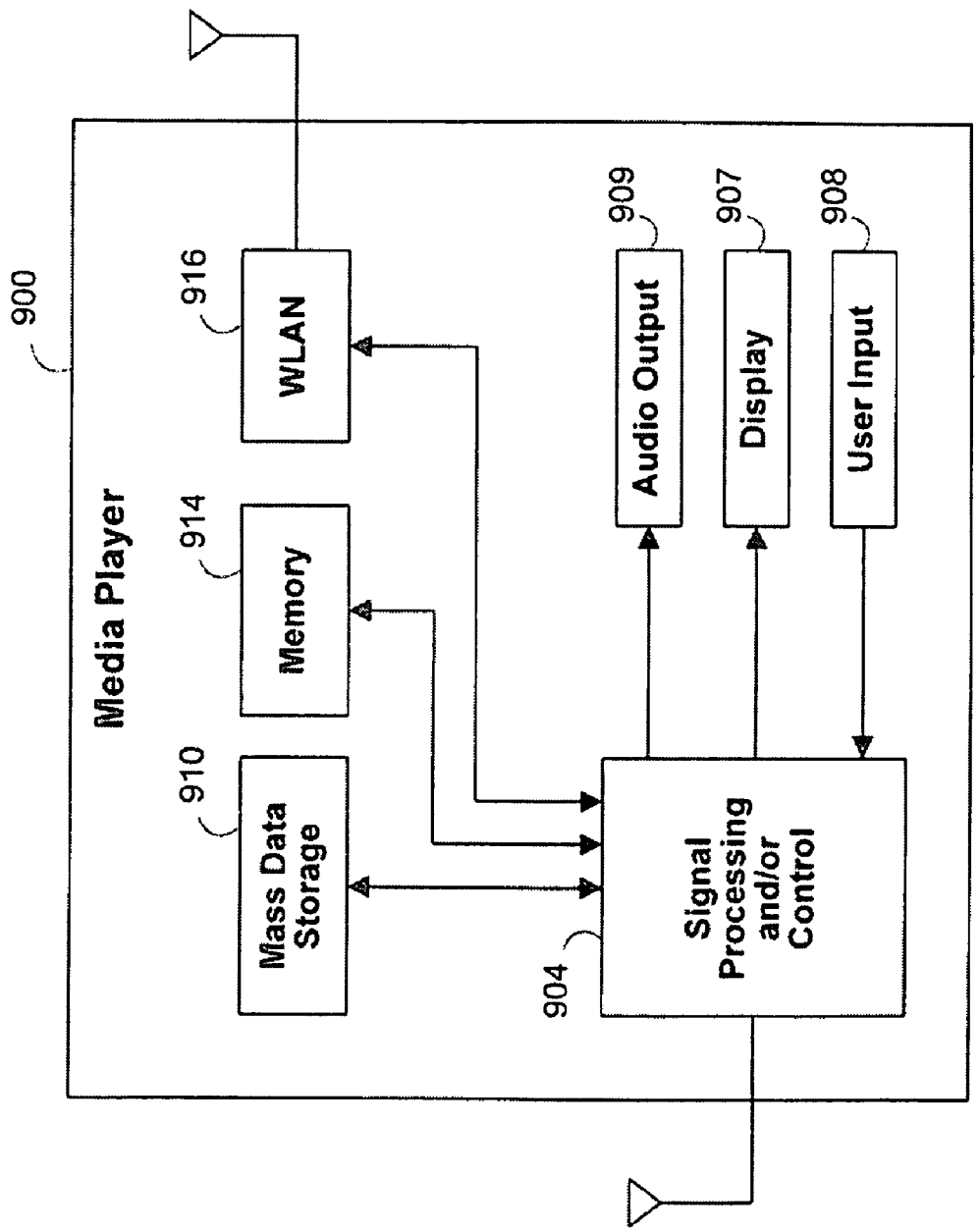
FIG. 7E is a block diagram of an exemplary media player that can employ the disclosed technology.

Referring now to FIG. 7E, the present invention can be implemented in a cellular phone 850 that may include a cellular antenna 851. The present invention may implement either or both signal processing and/or control circuits, which are generally identified in FIG. 7E at 852, a WLAN interface and/or mass data storage of the cellular phone 850. In some implementations, the cellular phone 850 includes a microphone 856, an audio output 858 such as a speaker and/or audio output jack, a display 860 and/or an input device 862 such as a keypad, pointing device, voice actuation and/or other input device. The signal processing and/or control circuits 852 and/or other circuits (not shown) in the cellular phone 850 may process data, perform coding and/or encryption, perform calculations, format data and/or perform other cellular phone functions.

The cellular phone 850 may communicate with mass data storage 864 that stores data in a nonvolatile manner such as optical and/or magnetic storage devices, for example, hard disk drives and/or DVD drives. At least one HDD may have the configuration shown in FIG. 7A and/or at least one DVD drive may have the configuration shown in FIG. 7B. The HDD may be a mini HDD that includes one or more platters having a diameter that is smaller than approximately 1.8". The cellular phone 850 may be connected to memory 866 such as RAM, ROM, low latency nonvolatile memory such as flash memory and/or other suitable electronic data storage. The cellular phone 850 also may support connections with a WLAN via a WLAN interface 868.

Referring now to FIG. 7F, the present invention can be implemented in a set top box 880. The present invention may implement either or both signal processing and/or control circuits, which are generally identified in FIG. 7F at 884, a WLAN interface and/or mass data storage of the set top box 880. The set top box 880 receives signals from a source such as a broadband source and outputs standard and/or high definition audio/video signals suitable for a display 888 such as a television and/or monitor and/or other video and/or audio output devices. The signal processing and/or control circuits 884 and/or other circuits (not shown) of the set top box 880 may process data, perform coding and/or encryption, perform calculations, format data and/or perform any other set top box function.

The set top box 880 may communicate with mass data storage 890 that stores data in a nonvolatile manner. The mass data storage 890 may include optical and/or magnetic storage devices, for example, hard disk drives and/or DVD drives. At least one HDD may have the configuration shown in FIG. 7A and/or at least one DVD drive may have the configuration shown in FIG. 7B. The HDD may be a mini HDD that includes one or more platters having a diameter that is smaller than approximately 1.8". The set top box 880 may be connected to memory 894 such as RAM, ROM, low latency nonvolatile memory such as flash memory and/or other suitable electronic data storage. The set top box 880 also may support connections with a WLAN via a WLAN interface 896.

Referring now to FIG. 7G, the present invention can be implemented in a media player 960. The present invention may implement either or both signal processing and/or control circuits, which are generally identified in FIG. 7G at 904, a WLAN interface and/or mass data storage of the media player 900. In some implementations, the media player 900 includes a display 907 and/or a user input 908 such as a keypad, touchpad and the like. In some implementations, the media player 900 may employ a graphical user interface (GUI) that typically employs menus, drop down menus, icons and/or a point-and-click interface via the display 907 and/or user input 908. The media player 900 further includes an audio output 909 such as a speaker and/or audio output jack. The signal processing and/or control circuits 904 and/or other circuits (not shown) of the media player 900 may process data, perform coding and/or encryption, perform calculations, format data and/or perform any other media player function.

The media player 900 may communicate with mass data storage 910 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices, for example, hard disk drives and/or DVD drives. At least one HDD may have the configuration shown in FIG. 7A and/or at least one DVD drive may have the configuration shown in FIG. 7B. The HDD may be a mini HDD that includes one or more platters having a diameter that is smaller than approximately 1.8". The media player 900 may be connected to memory 914 such as RAM, ROM, low latency nonvolatile memory such as flash memory and/or other suitable electronic data storage. The media player 900 also may support connections with a WLAN via a WLAN interface 916. Still other implementations in addition to those described above are contemplated.

The above described embodiments of the present invention are presented for the purposes of illustration and not of limitation. Since many embodiments of the invention can be made without departing from the spirit and scope of the invention, the invention resides in the claims hereinafter appended. Furthermore, the present invention is not limited to a particular implementation. For example, one or more steps of methods described above may be performed in a different order or concurrently and still achieve desirable results. The invention may be implemented in hardware, such as on an application specific integrated circuit (ASIC) or on a field-programmable gate array (FPGA). The invention may also be implemented in software.

What is claimed is:

1. A method of generating a plurality of parity symbols for a plurality of user symbols for a quasi-cyclic low-density parity check (QC-LDPC) code, the method comprising:
   receiving the plurality of user symbols;
   computing a parity seed vector based at least in part on the received user symbols; and
   multiplying a quasi-cyclic parity seed matrix by the parity seed vector to generate the plurality of parity symbols.

2. The method of claim 1 wherein the quasi-cyclic parity seed matrix comprises a square, dense quasi-cyclic matrix having dimensions equal to a dimension of the plurality of parity symbols.

3. The method of claim 1 wherein the quasi-cyclic parity seed matrix satisfies an equation $H_p M = A$, where $H_p$ is a parity portion of a quasi-cyclic parity-check matrix, M is the quasi-cyclic parity seed matrix, and A is a sparse quasi-cyclic matrix.

4. The method of claim 3 wherein computing the parity seed vector comprises:
   computing vector b satisfying an equation $b = H_u u$, where $H_u$ is a user portion of the quasi-cyclic parity-check matrix and u is the plurality of user symbols; and
   solving $Aw = b$ for w, the parity seed vector.

5. The method of claim 1 wherein the plurality of user symbols comprise k data components and the plurality of parity symbols comprise n−k data components and wherein the quasi-cyclic parity seed matrix is a square matrix of [n−k × n−k] circulants.

6. The method of claim 1 further comprising computing a new parity seed vector for each set of received user symbols while maintaining a same quasi-cyclic parity seed matrix.

7. A method of generating a plurality of parity symbols for a plurality of user symbols using a quasi-cyclic low-density parity check (QC-LDPC) code, the method comprising:
   receiving the plurality of user symbols;
   computing a parity seed vector based at least in part on a quasi-cyclic parity-check matrix;
   multiplying a quasi-cyclic parity seed matrix by the parity seed vector to generate a parity generator matrix;
   generating the plurality of parity symbols from the received user symbols and the parity generator matrix.

8. The method of claim 7 wherein the quasi-cyclic parity seed matrix comprises a square, dense quasi-cyclic matrix having dimensions equal to a dimension of the plurality of parity symbols.

9. The method of claim 7 wherein the quasi-cyclic parity seed matrix satisfies an equation $H_p M = A$, where $H_p$ is a parity portion of a quasi-cyclic parity-check matrix, M is the quasi-cyclic parity seed matrix, and A is a sparse quasi-cyclic matrix.

10. The method of claim 9 wherein computing the parity seed vector comprises:
    computing vector b satisfying an equation $b = H_u e_0$, where $H_u$ is a user portion of the quasi-cyclic parity-check matrix and $e_0$ is the first column of an identity matrix; and
    solving $Aw = b$ for w, the parity seed vector.

11. The method of claim 7 wherein the plurality of user symbols comprise k data components and the plurality of parity symbols comprise n−k data components and wherein the quasi-cyclic parity seed matrix is a square matrix of [n−k × n−k] circulants and the parity generator matrix is a dense matrix of [n−k×k] circulants.

12. A system for generating a plurality of parity symbols for a plurality of user symbols using a quasi-cyclic low-density parity check (QC-LDPC) code, the system comprising an LDPC encoder that:
  receives the plurality of user symbols;
  computes a parity seed vector based at least in part on the received user symbols; and
  multiplies a quasi-cyclic parity seed matrix by the parity seed vector to generate the plurality of parity symbols.

13. The system of claim 12 wherein the quasi-cyclic parity seed matrix comprises a square, dense quasi-cyclic matrix having dimensions equal to a dimension of the plurality of parity symbols.

14. The system of claim 12 wherein the quasi-cyclic parity seed matrix satisfies an equation $H_p M = A$, where $H_p$ is a parity portion of a quasi-cyclic parity-check matrix, M is the quasi-cyclic parity seed matrix, and A is a sparse quasi-cyclic matrix.

15. The system of claim 14 wherein computing the parity seed vector comprises:
  computing vector b satisfying an equation $b = H_u u$, where $H_u$ is a user portion of the quasi-cyclic parity-check matrix and u is the plurality of user symbols; and
  solving $Aw = b$ for w, the parity seed vector.

16. The system of claim 12 wherein the plurality of user symbols comprise k data components and the plurality of parity symbols comprise n−k data components and wherein the quasi-cyclic parity seed matrix is a square matrix of (n−k× n−k) circulants.

17. The system of claim 12 further comprising computing a new parity seed vector for each set of received user symbols while maintaining a same quasi-cyclic parity seed matrix.

18. A system for generating a plurality of parity symbols for a plurality of user symbols using a quasi-cyclic low-density parity check (QC-LDPC) code, the system comprising an LDPC encoder that
  receives the plurality of user symbols;
  computes a parity seed vector based at least in part on a quasi-cyclic parity-check matrix;
  multiplies a quasi-cyclic parity seed matrix by the parity seed vector to generate a parity generator matrix;
  generates the plurality of parity symbols from the received user symbols and the parity generator matrix.

19. The system of claim 18 wherein the quasi-cyclic parity seed matrix comprises a square, dense quasi-cyclic matrix having dimensions equal to a dimension of the plurality of parity symbols.

20. The system of claim 18 wherein the quasi-cyclic parity seed matrix satisfies an equation $H_p M = A$, where $H_p$ is a parity portion of a quasi-cyclic parity-check matrix, M is the quasi-cyclic parity seed matrix, and A is a sparse quasi-cyclic matrix.

21. The system of claim 20 wherein computing the parity seed vector comprises:
  computing vector b satisfying an equation $b = H_u e_0$, where $H_u$ is a user portion of the quasi-cyclic parity-check matrix and $e_0$ is the first column of an identity matrix; and
  solving $Aw = b$ for w, the parity seed vector.

22. The system of claim 18 wherein the plurality of user symbols comprise k data components and the plurality of parity symbols comprise n−k data components and wherein the quasi-cyclic parity seed matrix is a square matrix of [n−k× n−k] circulants and the parity generator matrix is a dense matrix of [n−k×k] circulants.

\* \* \* \* \*